US010630897B2

(12) United States Patent
Balar et al.

(10) Patent No.: US 10,630,897 B2
(45) Date of Patent: Apr. 21, 2020

(54) IMAGE SENSORS WITH CHARGE OVERFLOW CAPABILITIES (71) Applicant: SEMICONDUCTOR COMPONENTS INDUSTRIES, LLC, Phoenix, AZ (US)

(72) Inventors: Bharat Balar, Bengaluru (IN); Gurvinder Singh, Bangalore (IN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/995,399

(22) Filed: Jun. 1, 2018

(65) Prior Publication Data

US 2019/0373168 A1 Dec. 5, 2019

(51) Int. Cl.
*H04N 5/225* (2006.01)
*H04N 5/232* (2006.01)
*H01L 25/16* (2006.01)
*H04N 5/374* (2011.01)
*H01L 27/146* (2006.01)

(52) U.S. Cl.
CPC ....... *H04N 5/23229* (2013.01); *H01L 25/167* (2013.01); *H01L 27/14643* (2013.01); *H04N 5/2253* (2013.01); *H04N 5/2254* (2013.01); *H04N 5/374* (2013.01)

(58) Field of Classification Search
CPC .............................. H04N 5/378; H04N 5/3696
See application file for complete search history.

(56) References Cited

U.S. PATENT DOCUMENTS

2004/0080645 A1\* 4/2004 Shinohara ............... H04N 5/343
348/301
2005/0083421 A1\* 4/2005 Berezin ............... H04N 5/35527
348/308

(Continued)

OTHER PUBLICATIONS

Akahane et al. "Optimum Design of Conversion Gain and Full Well Capacity in CMOS Image Sensor With Lateral Overflow Integration Capacitor" IEEE Transactions on Electron Devices, vol. 56, No. 11, Nov. 2009.

(Continued)

*Primary Examiner* — Twyler L Haskins
*Assistant Examiner* — Dwight Alex C Tejano
(74) *Attorney, Agent, or Firm* — Treyz Law Group, P.C.; Tianyi He (57) ABSTRACT

An image sensor may include image pixels arranged in rows and columns. The image pixels may include respective overflow transistors and overflow capacitors and be configured to generate overflow charge during image acquisition. The overflow charge may be generated in a rolling manner on a row-to-row basis by repeatedly activating the overflow transistors and transfer transistors. Row control circuitry may be configured to provide a final synchronous overflow and transfer transistor activation across all of the pixel rows to provide a uniform overflow charge integration time period across all of the pixel rows. Row control circuitry may include a control signal generation circuit configured to generate control signals having full assertions in a first mode and partial assertions for the final synchronous overflow and transfer transistor activation in a second mode.

20 Claims, 5 Drawing Sheets

(56) References Cited

U.S. PATENT DOCUMENTS

| | | | | |
|---|---|---|---|---|
| 2006/0158539 A1* | 7/2006 | Koizumi | | H04N 5/3559 348/300 |
| 2007/0035649 A1* | 2/2007 | McKee | | H01L 27/14609 348/308 |
| 2008/0084489 A1* | 4/2008 | Kishi | | H04N 5/359 348/308 |
| 2010/0097508 A1* | 4/2010 | Yanagita | | H01L 27/14603 348/301 |
| 2013/0120624 A1* | 5/2013 | Okita | | H04N 5/335 348/300 |
| 2013/0229555 A1* | 9/2013 | Hashimoto | | H04N 5/3696 348/300 |
| 2014/0320690 A1* | 10/2014 | Kobayashi | | H01L 27/14609 348/222.1 |
| 2014/0340555 A1* | 11/2014 | Iwane | | H04N 5/343 348/308 |
| 2015/0373291 A1* | 12/2015 | Oh | | H04N 5/3575 348/324 |
| 2016/0028985 A1* | 1/2016 | Vogelsang | | H01L 27/14641 348/294 |
| 2016/0105624 A1* | 4/2016 | Handa | | H01L 27/14603 348/303 |
| 2016/0127669 A1* | 5/2016 | Yamazaki | | H04N 5/3696 348/300 |
| 2016/0219238 A1* | 7/2016 | Tsuboi | | H04N 5/37457 |

OTHER PUBLICATIONS

Akahane et al. "A Sensitivity and Linearity Improvement of a 100-dB Dynamic Range CMOS Image Sensor Using a Lateral Overflow Integration Capacitor" IEEE Journal of Solid-State Circuits, vol. 41, No. 4, Apr. 2006.

* cited by examiner

IMAGE SENSORS WITH CHARGE OVERFLOW CAPABILITIES

BACKGROUND

This relates generally to imaging devices, and more particularly, to imaging devices having charge overflow capabilities.

Image sensors are commonly used in electronic devices such as cellular telephones, cameras, and computers to capture images. In a typical arrangement, an electronic device is provided with an array of image pixels arranged in pixel rows and pixel columns. Circuitry is commonly coupled to each pixel column for reading out image signals from the image pixels.

The rows of image pixels each contain multiple photodiodes for generating charge in response to image light. The image pixels can be configured to have charge overflow capabilities. However, charge overflow integration time for each row can differ, which leads to image artifacts.

It would therefore be desirable to be able to provide imaging devices with improved image sensors.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
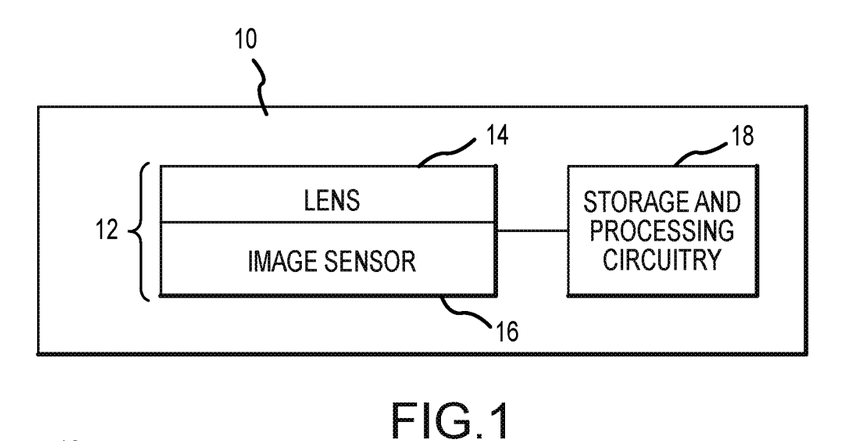
FIG. 1 is a diagram of an illustrative electronic device having an image sensor and processing circuitry for capturing images using an array of image pixels in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data.

Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel signals into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
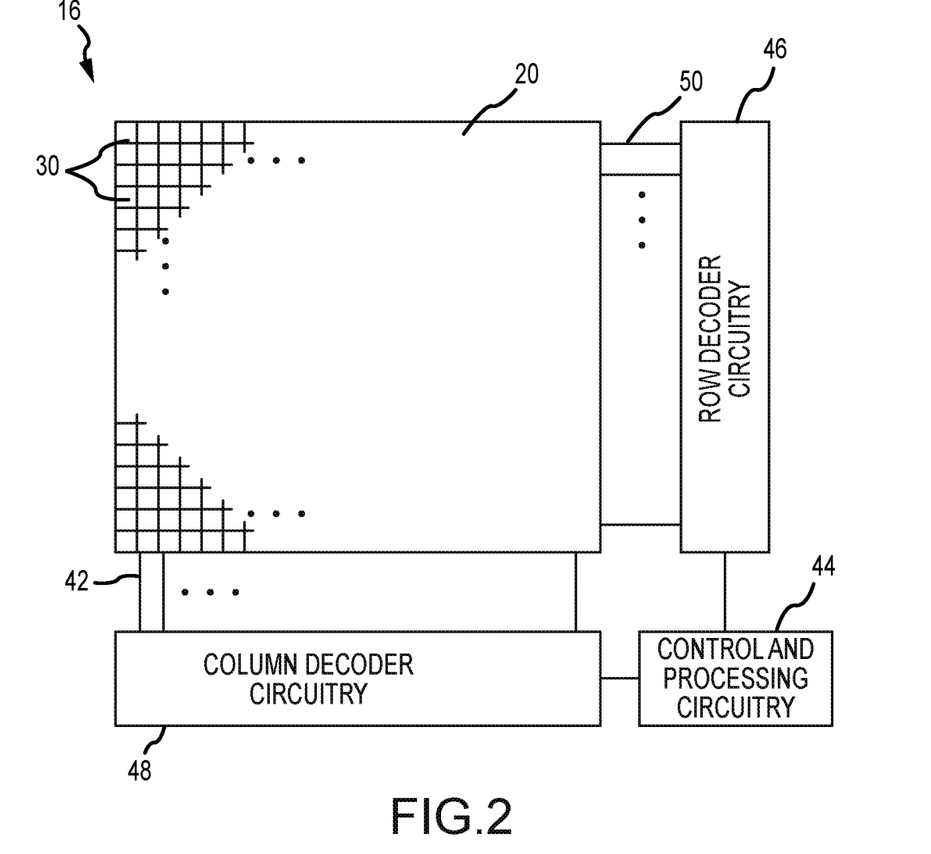
FIG. 2 is a diagram of an illustrative pixel array and associated readout circuitry for reading out image signals from the pixel array in accordance with an embodiment.

As shown in FIG. 2, image sensor 16 may include pixel array 20 containing image sensor pixels 30 (sometimes referred to herein as image pixels or pixels) arranged in rows and columns and control and processing circuitry 44 (which may include, for example, image signal processing circuitry). Pixel array 20 may contain, for example, hundreds or thousands of rows and columns of image sensor pixels 30. Control circuitry 44 may be coupled to row control circuitry 46 (sometimes referred to herein as row decoder circuitry or row circuitry) and column readout circuitry 48 (sometimes referred to herein as column control circuitry, readout circuitry, processing circuitry, or column decoder circuitry). Row control circuitry 46 may receive row addresses from control circuitry 44 and supply corresponding row control signals such as reset, row-select, charge transfer, dual conversion gain, and readout control signals to pixels 30 over row control lines 50. One or more conductive lines such as column lines 42 may be coupled to each column of pixels 30 in pixel array 20. Column lines 42 may be used for reading out image signals from pixels 30 and for supplying bias signals (e.g., bias currents, bias voltages, bias voltage levels, etc.) to pixels 30. If desired, during pixel readout operations, a pixel row in array 20 may be selected using row control circuitry 46 and image signals generated by image pixels 30 in that pixel row can be read out along column lines 42.

Image readout circuitry 48 may receive image signals (e.g., analog pixel values generated by pixels 30) over column lines 42. Image readout circuitry 48 may include sample and hold circuitry for sampling and temporarily storing image signals read out from pixel array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in pixel array 20 for operating pixels 30 and for reading out image signals from pixels 30. ADC circuitry in readout circuitry 48 may convert analog pixel values received from array 20 into corresponding digital pixel values (sometimes referred to as digital image data or digital pixel data). Image readout circuitry 48 may supply digital pixel data to control and processing circuitry 44 and/or processor 18 (FIG. 1) for pixels 30 in one or more pixel columns.

Pixel array 20 may be provided with a color filter array having multiple color filter elements, which allows a single image sensor to sample light of different colors. As an example, image sensor pixels such as image pixels 30 in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 30. A microlens may be formed over an upper surface of the color filter array to focus incoming light onto the photosensitive region associated with that pixel 30. A microlens may be formed over an upper surface of the color filter array to focus incoming light onto the photosensitive region associated with that pixel 30.

Figure 3:
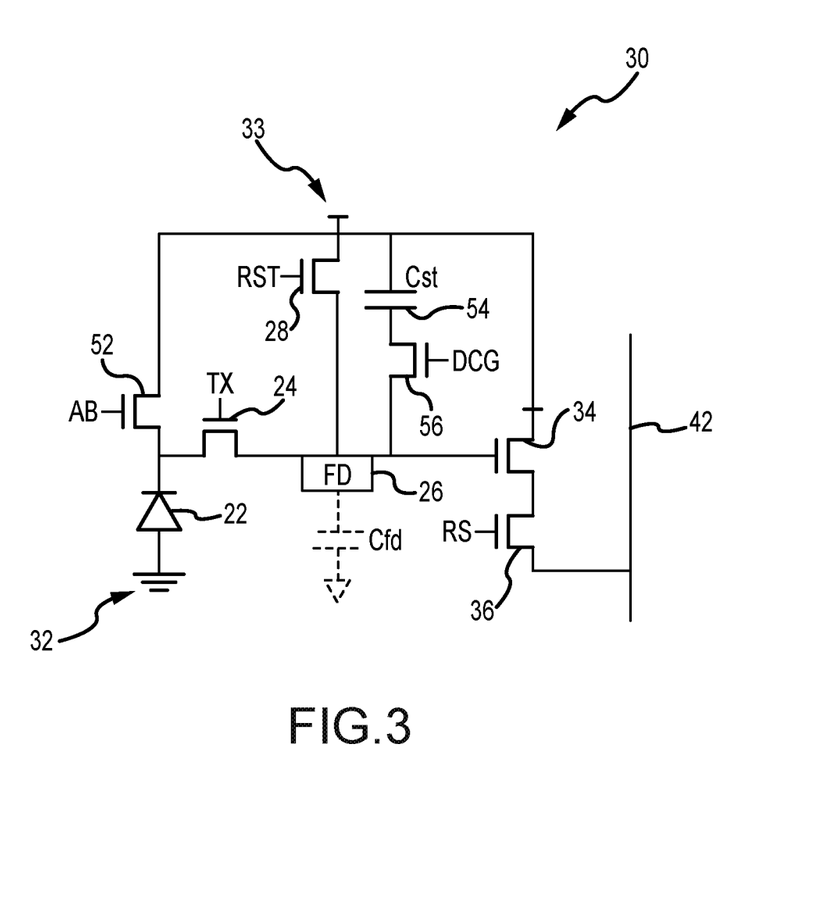
FIG. 3 is a schematic diagram of an illustrative image sensor pixel in accordance with an embodiment.

Circuitry in an illustrative image pixel 30 of image sensor 16 is shown in FIG. 3. As shown in FIG. 3, pixel 30 may include a photosensitive element such as photodiode 22 (or photodetector 22). A positive pixel power supply voltage (e.g., voltage Vaa) may be supplied at positive power supply terminal 33. A ground power supply voltage (e.g., voltage Vss) may be supplied at ground terminal 32 (sometimes referred to herein as another power supply terminal). Incoming light may be gathered by photodiode 22 after the incoming light passes through a color filter structure. Photodiode 22 may convert the light to electrical charge.

Before an image is acquired, control signal AB may be asserted to turn on (anti-blooming) transistor 52 (e.g., asserted-high to activate the corresponding transistor) and reset photodiode 22 to a reset voltage (e.g., voltage Vaa). Reset control signal RST may also be asserted. This turns on reset transistor 28 and resets charge storage node 26 (also referred to as a floating diffusion or a floating diffusion region) to a reset voltage. Reset control signal RST may then be deasserted to turn off reset transistor 28 (e.g., asserted-low to deactivate the corresponding transistor). When control signal AB is deasserted to turn off transistor 52, signal acquisition may begin at photodiode 22. After an image acquisition process is complete, transfer gate control signal TX may be asserted to turn on transfer transistor (transfer gate) 24. When transfer transistor 24 is turned on, the charge that has been generated by photodiode 22 in response to incoming light is transferred to charge storage node 26.

Charge storage node 26 may be implemented using a region of doped semiconductor (e.g., a doped silicon region formed in a silicon substrate by ion implantation, impurity diffusion, or other doping techniques). The doped semiconductor region (i.e., the floating diffusion FD) may exhibit a capacitance (e.g., capacitance Cfd) that is used to store the charge that has been transferred from photodiode 22. The signal associated with the stored charge on node 26 may be buffered by source-follower transistor 34. Row select transistor 36 may connect the source follower transistor 34 to column output line 42.

If desired, various types of image pixel circuitry may be used to implement the image pixels of image sensor 16. For example, each image sensor pixel 30 (see, e.g., FIG. 1) may be a three-transistor pixel, a pinned-photodiode pixel with four transistors, a global shutter pixel, etc. The circuitry of FIG. 3 is merely illustrative.

Still referring to FIG. 3, pixel 30 may also include overflow capacitor 54 (sometimes referred to herein as a charge storage structure) coupled to floating diffusion 26 via (overflow) transistor 56. In particular, pixel 30 may operate in an overflow mode of operation. In this mode of operation, pixel 30 may assert control signals TX and DCG (simultaneously) to activate transistors 24 and 56, respectively. Capacitor 54 may have a storage capacity that is much larger than that of floating diffusion 26. As such, capacitor 54 may be used extend the dynamic range of pixel 30 by storing large amounts of (overflow) charge (e.g., in bright image spots or scenes, during long integration periods, for charge integration). Pixel 30 may also operate in an LFM mode of operation, where control signals AB and TX (optionally in combination with control signal DCG) are asserted in an interweaved manner acquire an image signal effectively during a short exposure period (e.g., multiple short integration periods within a long exposure period). In other words, to use control signals AB and TX/DCG in the interweaved manner, when control signal AB is asserted-high, control signals TX and DCG are asserted-low, and vice versa. Operating pixel 30 in an LFM mode allows pixel 30 to capture incident light that may otherwise evade capture due to flickering effects.

Pixel array 20 may include pixels 30 arrange in a number of rows (e.g., arranged in rows 0-N). Each row may include multiple pixels 30, each configured with charge overflow capabilities (e.g., each pixel 30 may have at least one overflow transistor and at least one overflow capacitor 54). The scenario where pixel array 20 includes one or more pixels having a pixel configuration shown and described in connection with FIG. 3 is described herein as an example. If desired, one or more pixels in pixel array 20 may have any other suitable pixel configuration.

Figure 4:
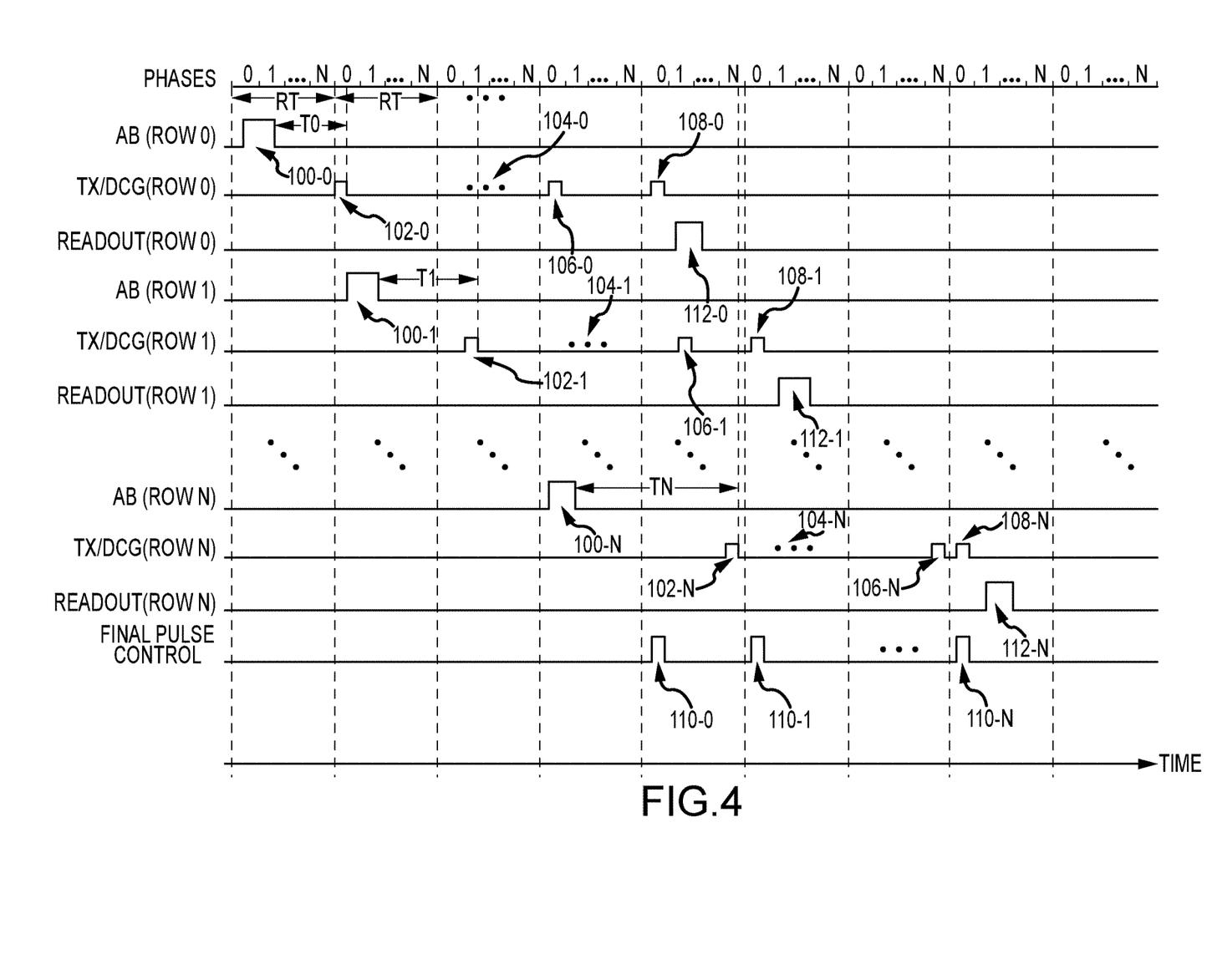
FIG. 4 is an illustrative timing diagram for operating an image pixel in a charge overflow mode of operation in accordance with an embodiment.

FIG. 4 shows an illustrative timing diagram for operating an image sensor (e.g., that includes pixel array 20 having rows 0-N) in an overflow mode of operation. Control signals AB, TX, and DCG are shown in FIG. 4 on a per-row basis. As an example, one or more pixels 30 in row 0 (e.g., all pixels 30 in row 0) may receive control signal AB for row 0 shown in FIG. 4 and may receive control signals TX and DCG for row 0 shown in FIG. 4. Pixels 30 in rows 1-N may similarly receive corresponding control signals AB, TX, and DCG for respective rows shown in FIG. 4. During an overflow mode of operation, control signals TX and DCG for each row may be asserted and deasserted simultaneously. As such, control signals TX and DCG for each row are shown in a combined manner for the sake of clarity. If desired, control signals TX and DCG for each row may also be asserted and deasserted separately (e.g., in a non-simultaneous manner).

During photodiode reset period 100 (sometime referred to herein as shutter period 100), control signals AB for pixels 30 in each row may be pulsed (e.g., asserted and deasserted) in a rolling manner across rows 0-N. In particular, shutter period 100 may include AB assertions 100-0, 100-1, . . . , 100-N. As an example, by pulsing control signals AB across all of the pixel rows, all photodiodes in pixel array 20 may be reset to a pixel supply voltage level (e.g., voltage level Vaa) and may be configured to begin an image acquisition period in sync relative to a respective row time period RT. In other words, as shown in FIG. 4, AB assertions 100-0, 100-1, . . . , 100-N may occur during the same phase (e.g., phase 0) of each respective row time. In particular, row 0 may begin its respective acquisition period at a particular phase in a first row time period RT, row 1 may being its respective acquisition period at the particular phase in a second row time period RT, etc. Photodiode reset period 100 may be part of a pixel reset period that includes other control signal pulses (e.g., control signal RST pulses, control signal DCG pulses, control signal TX pulses). Other pixel reset pulses are not shown in detail in order to not unnecessarily obscure the description of FIG. 4. Additionally, time delay between AB pulses and the start of a corresponding subsequent row time period may be the same across different rows. Different periods described herein refer to illustrative time periods, during which specific characterizing events (e.g., one or more control signal pulses for various pixel rows) may occur.

Rolling image acquisition across rows 0-N may occur during a plurality of periods (e.g., first overflow charge integration period 102, intermediate overflow charge integration periods 104, and another overflow charge integration period 106, and a final overflow charge integration period 108). During integration period 102, rows 0-N may each receive a pair of pulses for control signals TX and DCG (e.g., rolling TX and DCG assertions or rolling pulses 102-0, 102-1, . . . , 102-N). The TX and DCG pulses may be received in a rolling or sequential manner down rows 0-N on a per-row basis.

As an example, to transfer a portion of charge from one or more photodiodes to corresponding overflow capacitors in row 0, TX/DCG pulses 102-0 for row 0 may occur at a suitable time. Subsequent to (or simultaneously with) pulses 102-0, TX/DCG pulses 102-1 for row 1 may occur. Subsequent to (or simultaneously with) pulses 102-1, a third pair of TX/DCG pulses for row 2 may occur, etc. The image sensor may operate in a similar row-wise rolling manner until TX/DCG pulses 102-N for row N occurs, which ends an initial TX/DCG assertion period 102.

During the image acquisition period, pixel rows in the image sensor may operate with any suitable number of such overflow charge integration periods (e.g., periods similar to period 102 described above). This is shown as one or more possible additional TX/DCG pulses 104-0, 104-1, . . . , 104-N. Furthermore, period 106 may be a final overflow charge integration period similar to period 102. However, if readout operations were to be performed directly after period 106 (e.g., if rolling readout operations were to occur in the same corresponding row time period as assertions 106-0, 106-1, . . . , 106-N), some rows will have a longer overflow charge integration time period than others (e.g., periods T0, T1, TN, which are of different lengths will skew the total integration time period for different rows).

As an example, a total overflow charge integration time period for row 0 may span from the deassertion of control signal AB for row 0 (e.g., end of assertion 100-0) to the deassertion of control signals TX and DCG for row 0 (e.g., end of assertion 106-0). Similarly, a total overflow charge integration time period for row N may span from the deassertion of control signal AB for row N (e.g., end of assertion 100-N) to the deassertion of control signals TX and DCG for row N (e.g., end of assertion 106-N). Because the deassertion of control signal AB in period 100 is aligned to the same phase with respect to the corresponding row time periods for all rows, but deassertion of control signals TX and DCG is performed in a rolling or sequential manner at different phases (e.g., each set of phases 0-N in the different row time periods) with respect to the corresponding row time periods, the total overflow charge integration time period for row N may be longer than the total overflow charge integration time period for row 0. This difference in integration times across all rows will lead to non-linear image effects and image artifacts if unaddressed.

To mitigate these undesired effects, an image acquisition period may further include final overflow charge integration period 108. During period 108, a final pulse control signal may be asserted at various times to configure control signal generation circuitry to simultaneously pulse control signals TX and DCG for corresponding pixel rows (e.g., assertion 110-0 for row 0, assertion 110-1 for row 1, etc.). By introducing a final pair of TX/DCG pulses synced to a particular phase in each respective row time period (e.g., a fixed period from the start of corresponding row time periods), the total overflow charge integration time period for rows 0-N may be the same (e.g., spanning from a phase synchronous deassertion of control signal AB to a phase synchronous deassertion of control signals TX and DCG within respective row times). In other words, AB assertions 100-0, 100-1, . . . , 100-N are may occur during the same phase within different row time periods, final TX/DCG assertions 108-0, 108-1, . . . , 108-N may similar occur during the same phase within different row time periods. This provides the same total integration time period for different rows.

The conclusion of period 108 may also end the image acquisition period. An image signal readout period 112 may follow the image acquisition period. As an example, after the image acquisition period, a given pixel in any of rows 0-N may store an integrated overflow charge portion at an overflow capacitor (e.g., overflow capacitor 54 in FIG. 3) and a remaining charge portion at a photodiode (e.g., photodiode 22). During the image readout time period, readout circuitry (e.g., column readout circuitry 48 in FIG. 2) may perform readout operations on image level signals corresponding to the overflow charge portion and reset level signals (and optionally and the remaining charge portion). The readout circuitry may perform the read operations in a row-by-row rolling manner (e.g., readout assertions 112-0, 112-1, . . . , 112-N), as an example. In particular, control signals TX and DCG may be asserted during the readout period to access charge portions stored at corresponding photodiodes and capacitors, respectively. Additionally, other control signals may be pulsed to perform the readout operations. As an example, control signals RS and RST may also be asserted during the readout period. As shown in FIG. 4, image readout (e.g., readout assertions) may occur immediately or directly after the final TX/DCG assertions. Other signal readout assertions and reset signal readout assertions are not shown in FIG. 4 for the sake of clarity. If desired, any suitable number of readout operation may occur. As an example, following signal readout assertion 112-0 (e.g., signal sampling), a floating diffusion region reset operation may occur, and thereafter, a reset signal readout may occur (e.g., reset level sampling).

Rows 0-N described in connection with FIG. 4 may be arranged in any suitable order in pixel array 20. As an example, rows 0-N may be arranged in a sequential order along pixel array 20, where row 0 is a topmost row in pixel array 20, row 1 is a second row from the top of pixel array 20, . . . , and row N is a Nth row from the top of pixel array 20. As another example, rows 0-N may be arranged in a sequential order along pixel array 20, where row 0 is a bottommost row in pixel array 20, row 1 is a second row from the bottom of pixel array 20, . . . , and row N is a Nth row from the bottom of pixel array 20. These examples are merely illustrative. If desired, pixel array 20 may include other rows of pixels (e.g., rows of dummy pixels, rows of dark pixels, rows of other types of active image pixels, etc.).

Moreover, to operate in an overflow mode, the control signal generation circuitry (e.g., row circuitry) in the image sensor may provide at least two types of assertions (e.g., a full assertion at first voltage level $V_{REF1}$ and a partial assertion at a second voltage level $V_{REF2}$ that is lower in magnitude than the first voltage level). As an example, the control signal generation circuitry may provide control signals having full assertions (e.g., assertions having a logic high voltage level at voltage level $V_{REF1}$) for AB assertions 100-0, 100-1, . . . , 100-N, and assertions in the readout period for corresponding transistors in respective pixels 30 in pixel array 20. In particular, as shown in FIG. 4, control signal AB may be asserted as assertions 100-0, 100-1, . . . , 100-N to voltage level $V_{REF1}$. Similarly, control signals during image readout may be asserted to voltage level $V_{REF1}$.

While the full assertions (i.e., full pulses) may be necessary to move all of the charge stored in a particular storage region (e.g., photodiode 22, floating diffusion region 26, etc.), the control signal generation circuitry may provide control signals TX with partial assertions (e.g., assertions having a logic high voltage level at voltage level $V_{REF2}$, sometimes referred to as partial pulses) to corresponding transistors during the image acquisition period. As an example, when a given pixel 30 receives control signal TX having a partial assertion portion at transistor 24 (in FIG. 3), transistor 24 provides a partial potential barrier between photodiode 22 (in FIG. 3) and floating diffusion region 26 (in FIG. 3). As such, only a portion of the charge (i.e., overflow charge) generated at photodiode 22 is transferred to floating diffusion region 26. The control signal generation circuitry may also provide control signals DCG that are pulse synchronously with respective control signals TX to further transfer the overflow charge to capacitor 54 (in FIG. 3). Control signals DCG may similarly have partial assertion portions as shown in FIG. 4. However, if desired, control signal DCG pulsed simultaneously with partial assertions of control signal TX may have full assertion portions to ensure all overflow charge is transferred from floating diffusion region 26 to overflow capacitor 54.

The partial TX pulse and the partial DCG pulse may occur in a rolling manner as assertions 102-0, . . . , 102-N, 104-0, . . . , 104-N, and 106-0, . . . , 106-N. The control signal generation circuitry may be configured to generate simultaneous partial assertions of control signals TX and DCG (e.g., 108-0, . . . , 108-N).

Figure 5:
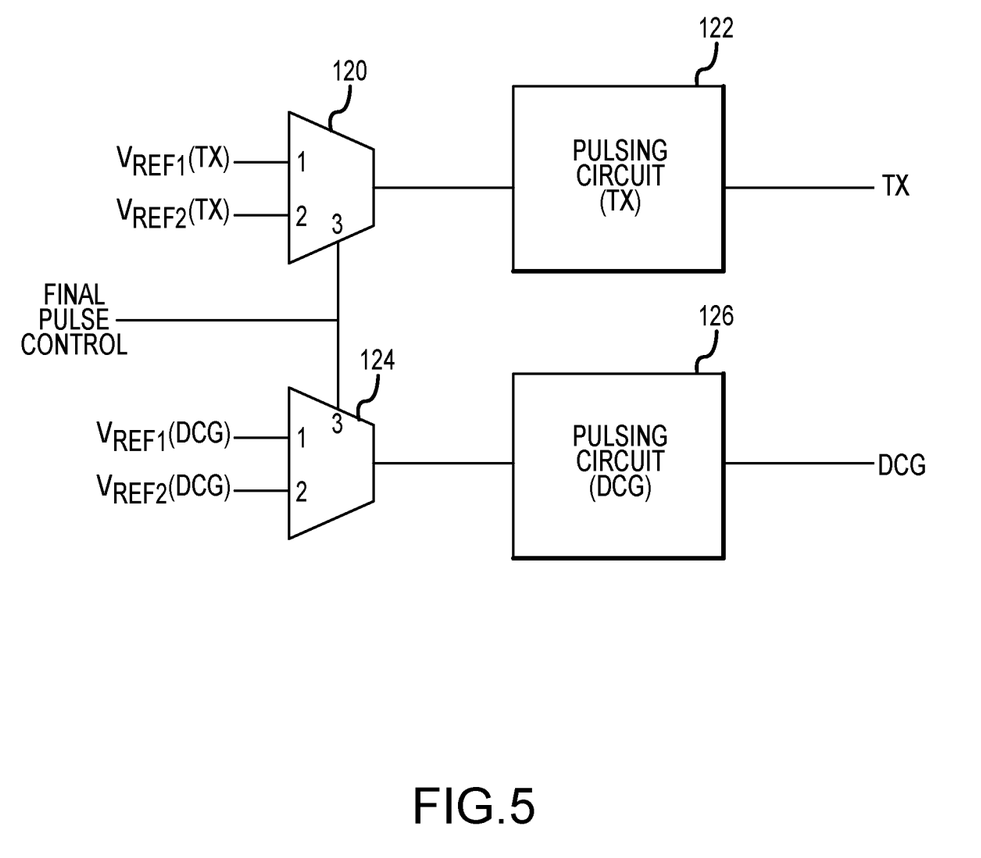
FIG. 5 is a diagram of illustrative control signal generation circuitry in accordance with an embodiment.

Because separate control signal generation circuits may be pulsed in an asynchronous (e.g., sequential) manner during overflow charge generation periods 102, 104, and 106, these control signal generation circuits may not be suitable for the synchronous pulse during charge generation period 108. As such, the image sensor may include control signal generation circuits that are configurable to generate both partial and full voltage pulses using shared circuitry. FIG. 5 shows an illustrative control signal generation circuit that may form the control signal generation circuitry. In particular, the control signal generation circuit may include multiplexers 120 (for control signal TX) and 124 (for control signal DCG), and pulsing circuits 122 (for control signal TX) and 126 (for control signal DCG. Multiplexers may be sometimes referred to herein as multiplexing circuits or selection circuits.

Multiplexer 120 may receive first reference voltage $V_{REF1}$ at a first input terminal, second reference voltage $V_{REF2}$ at a second input terminal, and a final pulse control signal (sometimes referred to herein as a final overflow charge transfer control signal) that controls the simultaneous assertion of control signals TX and DCG (during final period 108 in FIG. 4). Based on the final pulse control signal, multiplexer 120 may select one of voltages $V_{REF1}$ and $V_{REF2}$ as the output of multiplexer 120. TX pulsing circuit 122 may be coupled to multiplexer 120 and receive the output and generate a modulated control signal TX that is received at one or more rows of pixels 30 (e.g., at corresponding transfer transistors in pixels 30).

Similarly, multiplexer 124 may receive first reference voltage $V_{REF1}$ at a first input terminal, second reference voltage $V_{REF2}$ at a second input terminal, and the final pulse control signal (in FIG. 4). Based on the final pulse control signal, multiplexer 124 may select one of voltages $V_{REF1}$ and $V_{REF2}$ as the output of multiplexer 124. TX pulsing circuit 126 may be coupled to multiplexer 124 and receive the output and generate a modulated control signal DCG that is received at one or more rows of pixels 30 (e.g., at corresponding transfer transistors in pixels 30).

By using the control signal generation circuit in FIG. 5, the same control signal generation circuit may generate full pulses and partial pulses selectively. This efficient circuit structure may be used to generate any pulses for control signals TX and DCG using voltage level $V_{REF1}$ (e.g., in a first mode of operation for a particular control signal) and/or voltage level $V_{REF2}$ (e.g., in a second mode of operation for the particular control signal) during any of shutter, image acquisition, and image readout periods if desired. As an example, when the final pulse control signal is not asserted during shutter and image readout periods in FIG. 4, the control signal generation circuit may provide full assertion control signals to one or more pixels using voltage level $V_{REF1}$. As a further example, when the final pulse control signal is asserted during period 108, the control signal generation circuit may provide partial assertion control signals to one or more pixel using voltage level $V_{REF2}$. As yet another example, the partial pulses of control signals TX and DCG during overflow charge generation periods 102, 104, and 106 may be generated by different control signal generation circuits than the circuit shown in FIG. 5. If desired, the circuit shown in FIG. 5 may be shared by one or more pixels in one or more pixel rows to generate the simultaneous pulse the final TX/DCG pulse during final period 108 for the one or more pixel rows. Additionally, the control signal generation circuit shown in FIG. 5 may also be configured to provide controls signals for other transistors (e.g., control signals AB, RST, RS, etc.).

Figure 6:
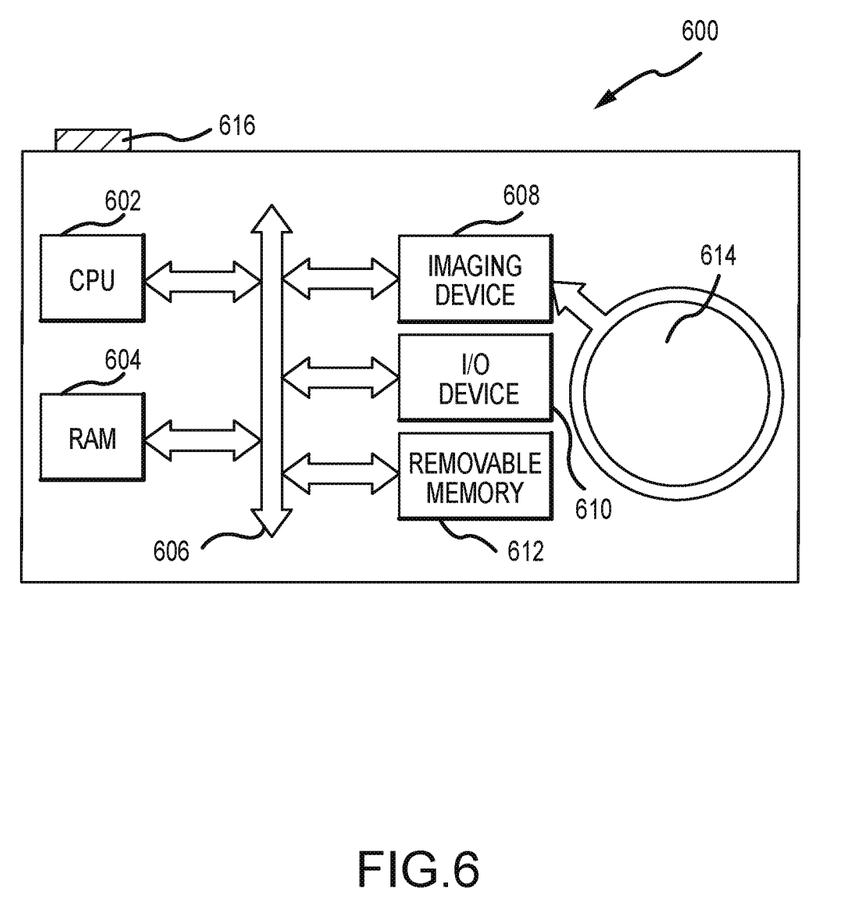
FIG. 6 is a block diagram of a processor system employing the embodiments of FIGS. 1-5 in accordance with an embodiment.

FIG. 6 is a simplified diagram of an illustrative processor system 600, such as a digital camera, which includes an imaging device 608 (e.g., camera module 12 of FIG. 1) employing an image sensor as described above in connection with FIGS. 1-5. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 600, for example a digital still or video camera system, generally includes a lens 614 for focusing an image onto one or more pixel array in imaging device 608 when a shutter release button 616 is pressed and a central processing unit (CPU) 602 such as a microprocessor which controls camera and one or more image flow functions. Processing unit 602 can communicate with one or more input-output (I/O) devices 610 over a system bus 606. Imaging device 608 may also communicate with CPU 602 over bus 606. System 600 may also include random access memory (RAM) 604 and can optionally include removable memory 612, such as flash memory, which can also communicate with CPU 602 over the bus 606. Imaging device 608 may be combined with the CPU, with or without memory storage on a single integrated circuit or on a different chip. Although bus 606 is illustrated as a single bus, it may be one or more busses, bridges or other communication paths used to interconnect system components of system 600.

Various embodiments have been described illustrating systems with and methods for image sensors configured with overflow integration functionalities.

In an embodiment, an image sensor may include image sensor pixels arranged in rows and columns. Rowing control circuitry, which may include control signal generation circuits, may be coupled to the image sensor pixels via row lines that are coupled to each image sensor pixel row. Each image sensor pixel may include a photodiode, a floating diffusion region, a charge storage structure (e.g., a capacitor), a transfer transistor interposed between the photodiodes and the floating diffusion region, and an overflow transistor interposed between the floating diffusion region and the charge storage structure.

The control signal generation circuits may generate control signals to control the transfer transistor and the overflow transistor. During an image acquisition time period, each photodiode in the image sensor pixels may generate charge in response to incident light, the control signals for each transfer transistor and each overflow transistor in the image sensor pixels may be periodically asserted (e.g., to activate the corresponding transfer and/or overflow transistor). A portion of the photodiode-generated charge (e.g., an overflow charge portion) may be generated by integrating different portions of the photodiode-generated charge transferred by the periodically asserted control signals.

During a first portion of the image acquisition time period, the control signals for each transfer and overflow transistor may be asserted in a sequential or rolling matter across the image sensor pixel columns. During a second portion of the image acquisition time period, the control signals for each transfer and overflow transistor may be asserted in a simultaneous or synchronous manner across the image sensor pixel columns. To efficiently provide the synchronous assertion during the second portion of the image acquisition time period, the image sensor may include a control signal generation circuit that is configurable to generate control signals that have full assertions to a first voltage level and partial assertions to a second voltage level that is smaller in magnitude than the first voltage level. The control signal generation circuit may receive an asserted final pulse control signal that may be asserted to generate the control signals having the partial assertions during the second portion of the image acquisition time period. The control signal generation circuit may receive a deasserted final pulse control signal during a reset time period and/or image readout time period to generate the control signals having the full assertions.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
   image sensor pixels arranged in a plurality of pixel rows, wherein each image sensor pixel in the image sensor pixels is configured to generate charge in response to incident light; and
   control signal generation circuitry coupled to the plurality of the pixel rows via a corresponding plurality of control paths and configured to generate control signals for the image sensor pixels provided over the plurality of control paths, wherein the control signal generation circuitry is configured to:
   assert a first control signal for a first pixel row at a first phase in a first row time period,
   assert a second control signal for a second pixel row at a second phase in a second row time period,
   assert the first control signal at a third phase in the second row time period, and
   assert the second control signal at the third phase in a third row time period.

2. The image sensor defined in claim 1, wherein the control signal generation circuitry is configured to receive an asserted pulse control signal based on which the first and second control signals are asserted at the third phase.

3. The image sensor defined in claim 2, wherein the control signal generation circuitry includes at least one selection circuit configured to receive a first voltage level at a first input terminal, a second voltage level at a second input terminal, and the asserted pulse control signal at a control terminal.

4. The image sensor defined in claim 3, wherein the control signal generation circuitry includes at least one pulsing circuit coupled to the at least one selection circuit and configured to receive an output voltage level generated by the at least one selection circuit and wherein the at least one pulsing circuit is configured to generate at least one of the control signals.

5. The image sensor defined in claim 4, wherein the first voltage level is greater in magnitude than the second voltage level and wherein the at least one selection circuit is configured to provide the second voltage level as the output voltage level to assert the first and second control signals at the third phase.

6. The image sensor defined in claim 5, wherein a given image sensor pixel in the image sensor pixels includes a transfer transistor coupled between a photosensitive region and a floating diffusion region and wherein the at least one pulsing circuit is configured to generate the first control signal, and the first control signal is received by the transfer transistor.

7. The image sensor defined in claim 5, wherein a given image sensor pixel in the image sensor pixels includes an overflow transistor coupled between a floating diffusion region and a capacitor and wherein the at least one pulsing circuit is configured to generate the first control signal, and the first control signal is received by the overflow transistor.

8. The image sensor defined in claim 5, wherein the at least one selection circuit is configured to provide the first voltage level as the output voltage level during shutter and readout operations.

9. The image sensor defined in claim 1, wherein at least one image sensor pixel in each pixel row in the plurality of pixel rows includes a photosensitive region configured to generate the charge in response to the incident light, a floating diffusion region, and a charge storage structure coupled to the floating diffusion region.

10. The image sensor defined in claim 9, wherein the at least one image sensor pixel in each pixel row in the plurality of pixel rows includes an overflow transistor that couples the floating diffusion region to the charge storage structure and wherein the overflow transistor for a given pixel is configured to receive the first control signal.

11. The image sensor defined in claim 9, wherein the least one image sensor pixel in each pixel row in the plurality of pixel rows includes a transfer transistor that couples the photosensitive element to the floating diffusion region and wherein the transfer transistor for a given pixel is configured to receive the first control signal in the respective control signals.

12. The image sensor defined in claim 9, wherein the assertions of the first and second control signals generate overflow charge portions and wherein charge storage structure is configured to store the overflow charge portions.

13. A method of operating an image sensor having a pixel array that includes a plurality of pixel rows each having at least one image pixel arranged as at least one pixel column, the method comprising:
    with the at least one pixel in each pixel row, generating charge in response to incident light; and
    with the at least one pixel in each pixel row, generating an overflow charge portion based on the generated charge, wherein generating the overflow charge portion comprises performing at least one rolling overflow charge transfer during respective phases across the at least one pixel column and performing a synchronous overflow charge transfer in reference to a particular phase across the at least one pixel column.

14. The method defined in claim 13, wherein the at least one pixel in each pixel row comprises a photosensitive element coupled to a floating diffusion via a first transistor, and a capacitor coupled to the floating diffusion via a second transistor, and wherein generating the charge in response to the incident light comprises generating the charge at the photosensitive element.

15. The method defined in claim 14, wherein performing the at least one rolling overflow charge transfer comprises transferring at least one portion of the charge generated by the photosensitive element to the capacitor.

16. The method defined in claim 15, wherein performing the synchronous overflow charge transfer comprises transferring an additional portion of the charge generated by the photosensitive element to the capacitor.

17. The method defined in claim 16, wherein generating an overflow charge portion comprises integrating the at least one portion of the charge with the additional portion of the charge to generate the overflow charge portion at the capacitor, the method further comprising:
    with readout circuitry, performing readout operations on the overflow charge portion at the capacitor; and
    with the readout circuitry, performing readout operations on a remaining charge portion at the photosensitive region.

18. A system, comprising:
    an image sensor that includes:
        image pixels arranged a plurality of rows and at least one column, wherein the image pixels are configured to generate image signal in response to incident light; and
        row control circuitry coupled to each row in the plurality of rows via one or more respective row lines, wherein the row control circuitry includes a control signal generation circuit configured to generate a control signal exhibiting one or more partial assertion pulses to generate the image signal in a first mode of operation and exhibiting one or more full assertion pulses to perform readout operations for the generated image signal in a second mode of operation.

19. The system defined in claim 18, wherein the one or more partial assertion pulses include a plurality of partial assertion pulses respectively asserted during the same given phase in a plurality of corresponding row time periods and include an additional partial assertion pulse asserted during an additional phase different from the given phase in an additional row time period.

20. The system defined in claim 18, wherein the control signal generation circuit is configured to receive a first voltage level and a second voltage level that is less than the first voltage level, wherein the one or more partial assertion pulses are generated based on the second voltage level, and wherein the one or more full assertion pulses are generated based on the first voltage level.

* * * * *